US007221209B2

(12) United States Patent
Ahuja et al.

(10) Patent No.: US 7,221,209 B2
(45) Date of Patent: May 22, 2007

(54) PRECISION FLOATING GATE REFERENCE TEMPERATURE COEFFICIENT COMPENSATION CIRCUIT AND METHOD

(75) Inventors: Bhupendra K. Ahuja, Fremont, CA (US); Hoa Vu, Milpitas, CA (US); Carlos Laber, Los Altos, CA (US)

(73) Assignee: Intersil Americas, Inc, Milpitas, CA (US)

( * ) Notice: Subject to any disclaimer, the term of this patent is extended or adjusted under 35 U.S.C. 154(b) by 30 days.

(21) Appl. No.: 11/129,455

(22) Filed: May 12, 2005

(65) Prior Publication Data

US 2006/0255854 A1 Nov. 16, 2006

(51) Int. Cl.
*H01L 35/00* (2006.01)

(52) U.S. Cl. ........................................ 327/513

(58) Field of Classification Search ................ 327/513, 327/539

See application file for complete search history.

(56) References Cited

U.S. PATENT DOCUMENTS

| | | | | | |
|---|---|---|---|---|---|
| 5,059,820 | A | * | 10/1991 | Westwick | 327/539 |
| 5,352,972 | A | * | 10/1994 | Pernici et al. | 323/313 |
| 5,563,504 | A | * | 10/1996 | Gilbert et al. | 323/316 |
| 5,945,871 | A | * | 8/1999 | Kausel et al. | 327/538 |
| 6,060,874 | A | * | 5/2000 | Doorenbos | 323/316 |
| 6,147,522 | A | | 11/2000 | Rhode et al. | |
| 6,366,071 | B1 | | 4/2002 | Yu | |
| 6,650,175 | B2 | * | 11/2003 | Messager | 327/541 |
| 6,853,238 | B1 | | 2/2005 | Dempsey et al. | |
| 7,009,373 | B1 | * | 3/2006 | Garavan | 323/313 |
| 2005/0146377 | A1 | | 7/2005 | Owen | |

OTHER PUBLICATIONS

Song, et al., "A Precision Curvature-Compensated CMOS Bandgap Reference", IEEE Journal of Solid-State Circuits, vol. sc-18, No. 6, pp. 634-643, Dec. 1983.

Jiang, et al., "Design of Low-Voltage Bandgap Reference Using Transimpedance Amplifier", IEEE Transactions on Circuits and Systems-II: Analog and Digital Signal Processing, vol. 47, No. 6, pp. 552-555, Jun. 2000.

* cited by examiner

*Primary Examiner*—Jeffrey Zweizig
(74) *Attorney, Agent, or Firm*—Nixon Peabody LLP

(57) ABSTRACT

A circuit and corresponding method for a precision floating gate voltage reference that uses a feedback loop, conduction of tunnel devices, and a bandgap cell to accurately program a desired charge level on a floating gate and provide a predictable and programmable temperature coefficient parameter for such voltage reference. In one embodiment, a bandgap cell is coupled through a capacitor to the floating gate storage node for providing a voltage source for canceling the temperature coefficient (TC) of the storage capacitor. The circuit and method enables TC to be minimized by either choosing the proper voltage source characteristics or alternatively, by choosing the proper ratio of two capacitors. The bandgap cell can alternatively be designed to have positive TC (PTAT voltage sources) or negative TC (VBE junction).

24 Claims, 6 Drawing Sheets

PRECISION FLOATING GATE REFERENCE TEMPERATURE COEFFICIENT COMPENSATION CIRCUIT AND METHOD

FIELD OF INVENTION

The invention relates generally to the field of circuit design and in particular to improving the accuracy of a floating gate voltage reference circuit.

BACKGROUND OF INVENTION

One of the key performance parameters for precision voltage references and comparators is the temperature coefficient (TC). The TC parameter specifies the amount of voltage change which occurs as a result of a change in temperature. TC for a given component may be positive, negative, or may change direction over various temperature ranges.

The bandgap and buried zener are two known methods for implementing voltage references. The bandgap and buried zener voltage references utilize special bipolar or BiCMOS process technologies. These types of references require various trimming methods, e.g., laser trimmed thin-film resistors or metal fuses, for achieving close to 1 mV initial accuracy and a TC at or below 5 ppm per degree C.

More recently, a precision floating gate voltage reference (FGREF) has been implemented on EEPROM CMOS technology. A precision floating gate voltage reference stores a known voltage on a floating capacitor tied to the input of an opamp. Tunnel diodes are typically used as switches to charge the floating capacitor during the programming (set) mode. The TC of the FGREF depends on the TC of the storage capacitor. In order to achieve close to zero TC, known circuits and methods utilize a mix of different types of capacitors for causing the composite TC of the capacitors to be near zero.

FIG. 1 illustrates a simplified schematic of an ideal prior art floating gate voltage reference circuit 10. The charge on a capacitor C is set at the factory by using one or more tunnel diodes, as at $S_0$, as an ideal switch for coupling an input voltage $Vs_0$ to capacitor C in a programming (set) mode. Capacitor C holds the programmed voltage, Vs, at a storage node, node 11, which is coupled to the input of a unity gain buffer 12. The unity gain buffer 12 is provided to isolate the floating gate storage node 11 from a load at the output terminal 14 of buffer 12. At the conclusion of the set mode, the output $V_{out}$ of the voltage reference circuit 10 at node 14 has been set to a voltage that is a function of, and preferably is equal to the input set voltage $V_{so}$ received at an input terminal 16.

The temperature coefficient of voltage reference circuit 10 is a function of the TC of the capacitor C. The TC of capacitor C is typically fairly low (~+20 ppm/C) for Poly1/Poly2 capacitors in CMOS technology. Since the storage node 11 is floating and fully protected from any outside or inside contact, charge conservation principles can be applied to calculate the TC of Vout due to the change in the value of Capacitor C with temperature. A set of Equations 1 below shows that TC of Vout is the negative of the TC of the capacitor C.

EQUATIONS 1: Charge at Storage Node 11 is given by $Q(t_0)$=constant, determined at programming time and a selected temperature, $t_0$.

Assume: $C(t)=C_0(1+\alpha(t-t_0))$, where $t_0=25°$ C. (ambient temperature), where t is the die temperature, $C_0$ is the capacitance of capacitor C, and α is the TC of capacitor C.

$$Q(t) = C_0 \cdot V_S(25)$$

$$\therefore Q(t) = C(t) \cdot V_S(t) = C_0 \cdot V_S(25)$$

$$\Rightarrow V_S(t) = \frac{C_0 \cdot V_S(25)}{C(t)} = \frac{C_0 \cdot V_S(25)}{C_0(1+\alpha\cdot\Delta t)}$$

$$\text{or } V_S(t) \cong V_S(25)\cdot(1-\alpha\cdot\Delta t)$$

$$\text{or } V_R(t) = V_R(25)\cdot(1-\alpha\cdot\Delta t)$$

$$TC_{V_R} = \frac{1}{V_R}\cdot\frac{\partial V_R}{\partial t} = -\alpha$$

cos⌀cos⌀

Since the TC of Vout is the negative of the TC of the capacitor C, in order to get zero TC at Vout, capacitors with near-zero TC are required. In one known method, two different types of capacitors are combined for minimizing TC. FIG. 2*a* illustrates an exemplary prior art circuit 20 utilizing a differential scheme for achieving a minimum TC. The differential scheme with feedback is utilized in order to address drawbacks of the circuit 10, including common mode noise of the buffer amplifier 12 over a wide range of reference voltage values. The combined composite capacitor comprises a Poly1 to Poly2 capacitor, referred to as CP type capacitor, connected in parallel with a Poly1 to N+ Diffusion capacitor, referred to as CPD type capacitor, as illustrated symbolically in FIG. 2*b*. The CP capacitor typically has a TC of +20 ppm/deg C. and the CPD capacitor typically has a TC of −10 ppm/deg C. TC. This known method includes adjusting the area ratios of CP to CPD in order to cause the TC at Vout to approach zero, in accordance with a set of Equations 2.

EQUATIONS 2: Where t=die Temperature, $t_0$=ambient temperature during the programming of the voltage reference circuit, $\Delta t=t-t_0$, α=TC of a CP type capacitor, and β=TC of a CPD type capacitor:

$$C = CP + CPD$$

$$CP = CP_0(1+\alpha\cdot\Delta t)$$

$$CPD = CPD_0(1-\beta\cdot\Delta t)$$

$$\therefore C = (CP_0 + CPD_0) + (\alpha\cdot CP_0 - \beta\cdot CPD_0)\Delta t = (CP_0 + CPD_0)\left(1 + \frac{\alpha\cdot CP_0 - \beta\cdot CPD_0}{CP_0 + CPD_0}\cdot\Delta t\right)$$

$$TC_{eq} = \gamma = \frac{\alpha\cdot CP_0 - \beta\cdot CPD_0}{CP_0 + CPD_0}$$

Thus, by choosing $CP_0/CPD_0$ appropriately, one can get a Zero TC value.

In FIG. 2*a*, the switches $S_0$ and $S_1$ are coupled between an input terminal 24 and respective inputs of an opamp 22 for setting a set voltage, $V_{s0}$ on a storage node 21 and on the inverting input of opamp 22, respectively. Storage capacitors $CPD_0$ and $CP_0$ are connected in parallel between node 21 and ground. Feedback capacitors $CPD_1$ and $CP_1$ are connected in parallel between the negative input of opamp 22 and, via a switch $S_2$, the output of circuit 20. The switch $S_2$ is used to set the output end of the feedback capacitor $CP_1$ to a desired reference voltage value, $V_R$.

As shown in FIG. 2*a*, when two different types of capacitors are used to achieve close to a zero TC, it is known to use a mix of CP and CPD capacitors. As is also seen, this method is applied to both the storage capacitor in the circuit as well as the feedback capacitor. The TC of the CPD capacitor has been found, however, to be dependent on the applied voltage. Consequently, attempting to use two types of capacitors, e.g., as shown in FIG. 2*a*, to obtain zero TC for different output voltage values, is very challenging and is mostly an empirical exercise.

What is therefore needed is a method for TC cancellation for a floating gate voltage reference that uses only one type of capacitor so as to provide a predictable and programmable TC for the overall voltage reference generator circuit. What is also needed is an analog floating gate voltage reference circuit for accurately programming a desired charge level on a floating gate and for making TC reduction methods more reliable and repeatable for different output voltage values.

SUMMARY OF THE INVENTION

The present invention overcomes the drawbacks of known circuits and methods by providing a circuit and method for minimizing TC more reliably in a high precision floating gate reference. The circuit and corresponding method of the present invention uses only one type of capacitor so as to provide a predictable as well as a programmable TC for such references.

In one embodiment according to the present invention, a bandgap cell is coupled through a capacitor to the storage node in order to cancel the TC of the storage capacitor, wherein both capacitors are of the same type. The bandgap cell can be designed to have Positive TC (Proportional to Absolute Temperature (PTAT) source) or Negative TC (Voltage Base-Emitter (VBE) junction source).

An advantage of the present invention is that the TC of a PTAT or VBE source is very reliable and nearly process/technology independent. As a result, a more predictable and programmable TC of the overall FGREF is provided.

Standard CMOS technology has only one type of capacitor element. Thus, another advantage of the present invention is that it enables minimizing TC in a high precision floating gate voltage reference circuit utilizing standard CMOS technology.

Another advantage of the present invention is that it makes minimizing TC more predictable. In an alternative embodiment, a predictable TC value can be dialed in via a programmable control register.

Broadly stated, the present invention provides, in a floating gate voltage reference circuit for storing a predetermined voltage at a first node coupled to an input of an opamp wherein a voltage reference output is generated at the output of the opamp as a function of the charge of the floating gate, the reference circuit having a first capacitor coupled to the first node; a method for improving the accuracy of the voltage reference output as a function of temperature, comprising coupling a second capacitor to an input of the opamp; wherein the first capacitor and the second capacitor are the same type of capacitor; supplying a voltage source providing an output having a predetermined and substantially constant Temperature Coefficient (TC); and connecting the voltage source in series combination with the second capacitor so as to compensate for the TC of the first capacitor such that, during a read mode of the reference circuit, the temperature coefficient, TC, of the voltage reference output is substantially reduced.

Broadly stated, the present invention also provides a floating gate reference circuit for improving the accuracy of a voltage reference output as a function of temperature comprising a floating gate for storing charge thereon, the charge appearing at a first node coupled to an input of an opamp, wherein a voltage reference output is generated at the output of the opamp as a function of the charge of the floating gate, a first capacitor coupled to the first node; a second capacitor coupled to an input of the opamp; wherein the first capacitor and the second capacitor are the same type; and a voltage source providing an output voltage having a predetermined and substantially constant TC; the voltage source connected in series combination with the second capacitor so as to compensate for the TC of the first capacitor such that, during a read mode of the reference circuit, the TC of the voltage reference output is substantially reduced.

These and other embodiments, features, aspects, and advantages of the invention will become better understood with regard to the following description, appended claims and accompanying drawings.

BRIEF DESCRIPTION OF THE DRAWINGS

The foregoing aspects and the attendant advantages of the present invention will become more readily appreciated by reference to the following detailed description, when taken in conjunction with the accompanying drawings, wherein.

Reference symbols or names are used in the Figures to indicate certain components, aspects or features shown therein, with reference symbols common to more than one Figure indicating like components, aspects or features shown therein.

DETAILED DESCRIPTION OF THE INVENTION

The present invention is a system and method for improving the accuracy of the output reference voltage ($V_{ref}$) of a floating gate voltage reference circuit as a function of temperature. An object of the present invention is to minimize Tc in a high precision floating gate voltage reference circuit in a more predictable and programmable way.

Figure 1:
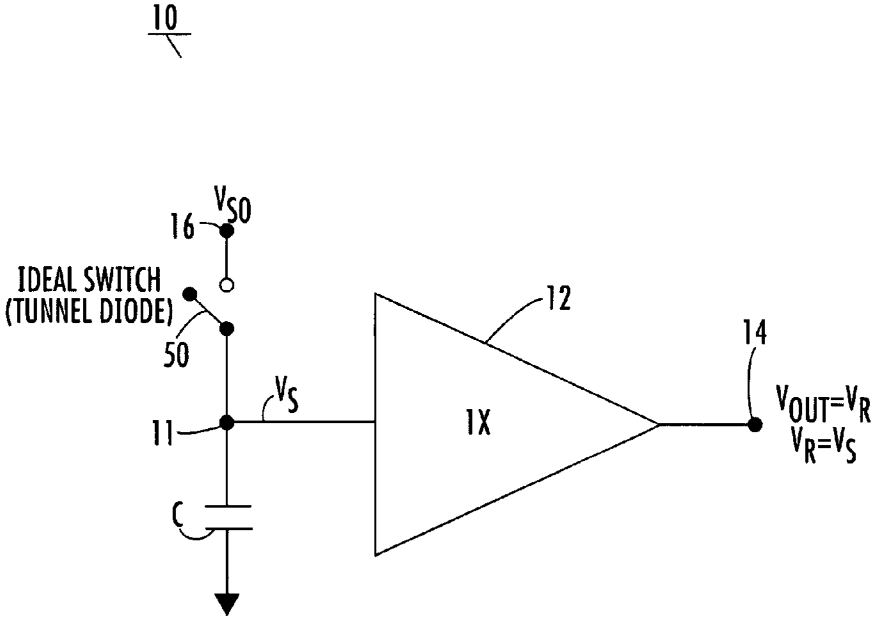
FIG. 1 (PRIOR ART)
FIG. 1 illustrates a simplified schematic of a prior art floating gate voltage reference circuit 10 in a programming (set) mode.
Figure 2A:
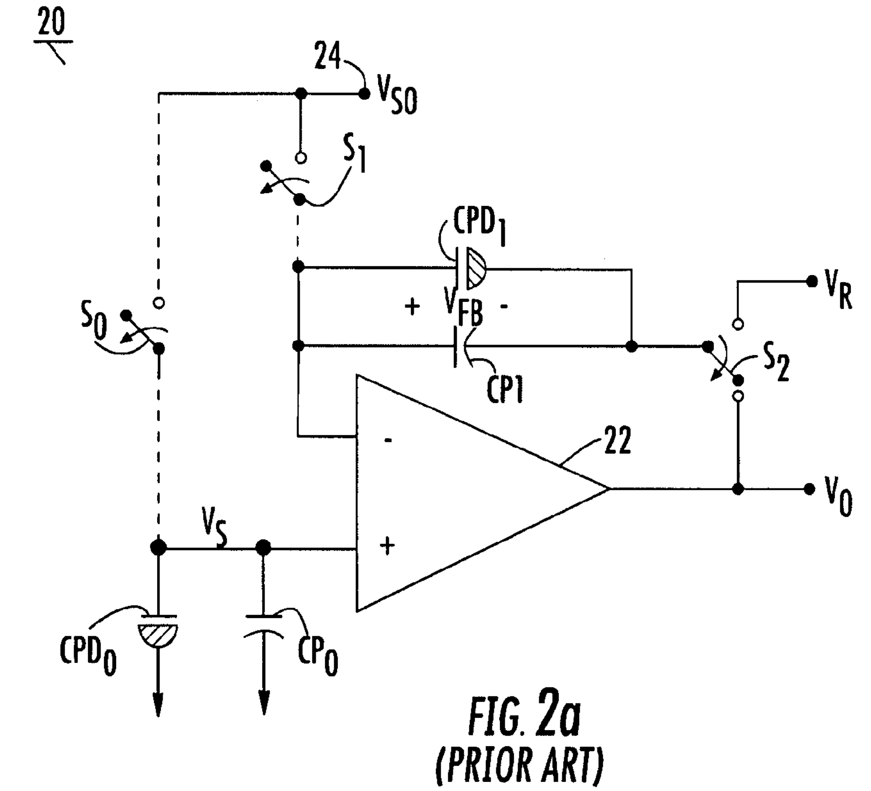
FIG. 2a (PRIOR ART)
FIG. 2*a* illustrates an exemplary circuit utilizing a differential scheme for implementing the method using two different type of capacitors method for minimizing TC.
Figure 2B:
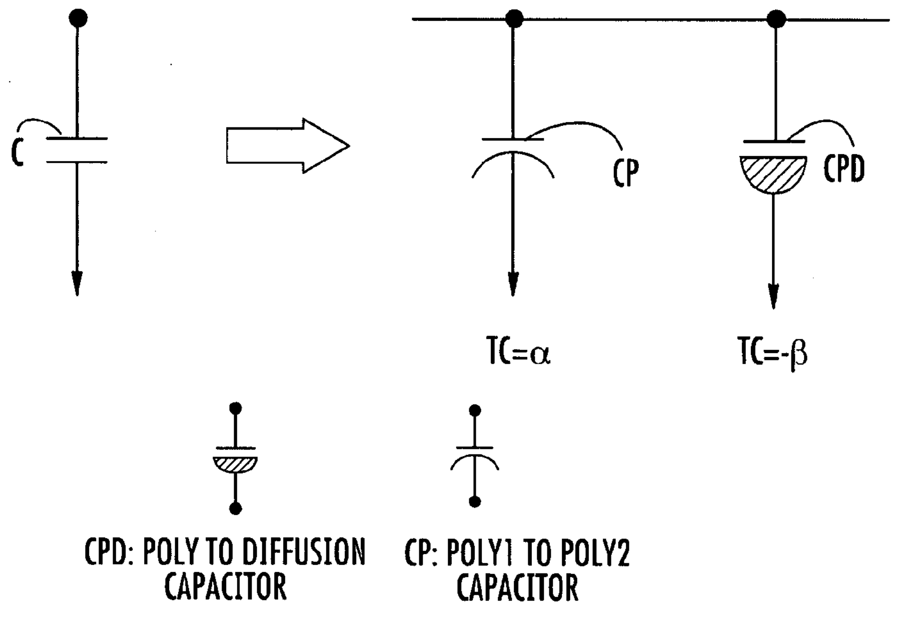
FIG. 2b (PRIOR ART)
FIG. 2*b* illustrates a schematic and corresponding symbology for a combined composite capacitor comprising a Poly1 to Poly2, CP type capacitor, and a Poly1 to N+ Diffusion, CPD type capacitor, as shown in the circuit in FIG. 2*a;*
Figure 3A:
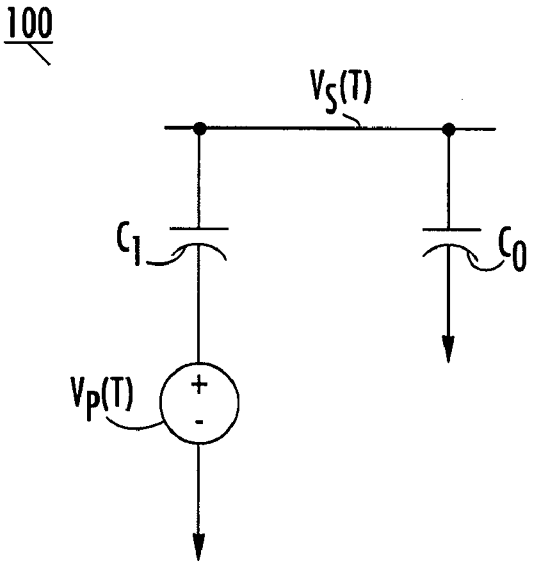
FIG. 3*a* illustrates a conceptual schematic of a circuit having two capacitors of the same type and TC and a voltage source connected to capacitor $C_1$.

FIG. 3*a* illustrates a conceptual schematic of a circuit 100 having two capacitors of the same type and TC and a voltage source connected to capacitor $C_1$. The circuit 100 includes a series combination of a capacitor C1 and a positive voltage source, $V_p$. The series combination is connected in parallel with a capacitor $C_0$ between a storage node at a voltage Vs and ground. The voltage source, $V_p$, has a predetermined and constant TC. The voltage source, $V_p$, can be made using bandgap cells, for example, having Proportional to Absolute Temperature (PTAT) voltage outputs which typically have a well defined TC of +3300 ppm/deg C. value. For this example, as the value of capacitor C1 varies with temperature, $V_p$ also changes, thereby canceling the overall changes in voltage, Vs, as shown in a set of Equations 3.

EQUATIONS 3: Where t=die Temperature, $t_0$=ambient temperature, i.e., 25° C., capacitors $C_0$ and $C_1$ are the same type of capacitors with the same TC=α:

At $t_0$=25° C., $$V_S(25)=V_{S0}$$

$$V_P(25)=V_{P0}$$

$$Q(25)=C_0V_{S0}+C_1(V_{S0}-V_{P0})$$

Assuming $V_P(t)$ is provided such that:

$$V_P(t)=V_{P0}(1+\beta\cdot\Delta t)$$

$$\Delta t=t-25$$

Then, $$V_R(t)=V_S(t)$$

$$=\frac{Q(25)}{C_0(1+\alpha\cdot\Delta t)V_{S0}+C_1(1+\alpha\cdot\Delta t)(V_{S0}-V_{P0}(1+\beta\cdot\Delta t))}$$

$$=\frac{Q(25)}{C_0V_{S0}+C_1(V_{S0}-V_{P0})+\Delta t(\alpha\cdot C_0V_{S0}+\alpha\cdot C_1V_{S0}-\beta\cdot C_1V_{P0}-\alpha\cdot C_1V_{P0})}$$

$$TC_{V_R}=\frac{1}{V_R}\cdot\frac{\partial V_R}{\partial t}\bigg|_{t=25}$$

$$=-\frac{1}{V_R}\{\alpha(C_0+C_1)V_{S0}-(\alpha+\beta)C_1\cdot V_{P0}\}$$

Thus, again by choosing a proper ratio of $C_1/C_0$ or $V_{P0}$, one can minimize TC.

Figure 3B:
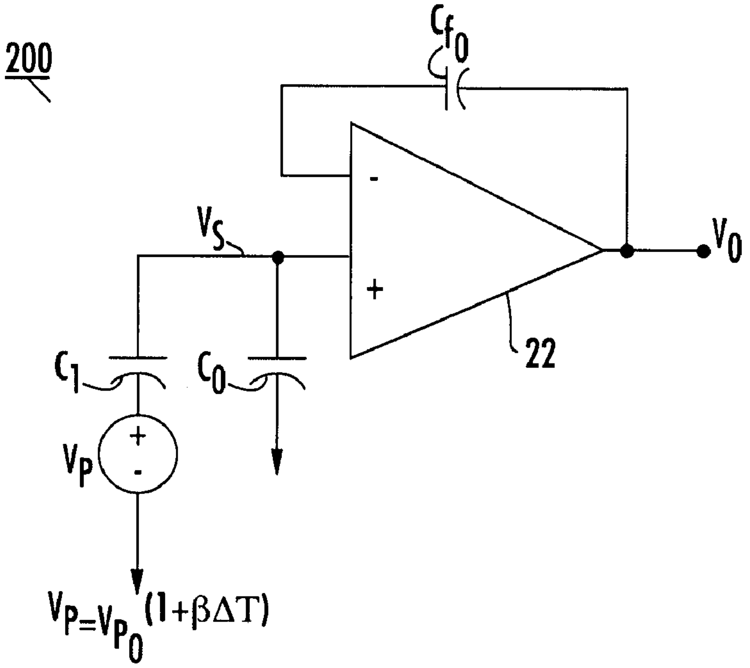
FIG. 3*b* shows an embodiment further illustrating the concept of the present invention where a voltage source with TC=β is connected to capacitor $C_1$ to cancel the TC of $C_0$ in a voltage reference circuit.

FIG. 3*b* shows an embodiment further illustrating the concept of the present invention where a voltage source with TC=β is connected to capacitor $C_1$ to cancel the TC of $C_0$ in a voltage reference circuit. A voltage reference circuit 200 adds an opamp 22 to the circuit 30 in FIG. 3*a*. A feedback capacitor $C_{fo}$ is coupled from the output, $V_o$, to the negative input of opamp 22. A voltage source, Vp, which is preferably a PTAT voltage source having $V_P(t)=V_{P0}(1+\beta\cdot\Delta t)$), as shown in Equations 3, is connected in series with a capacitor $C_1$ for enabling the cancellation of the TC of $C_0$.

Figure 3C:
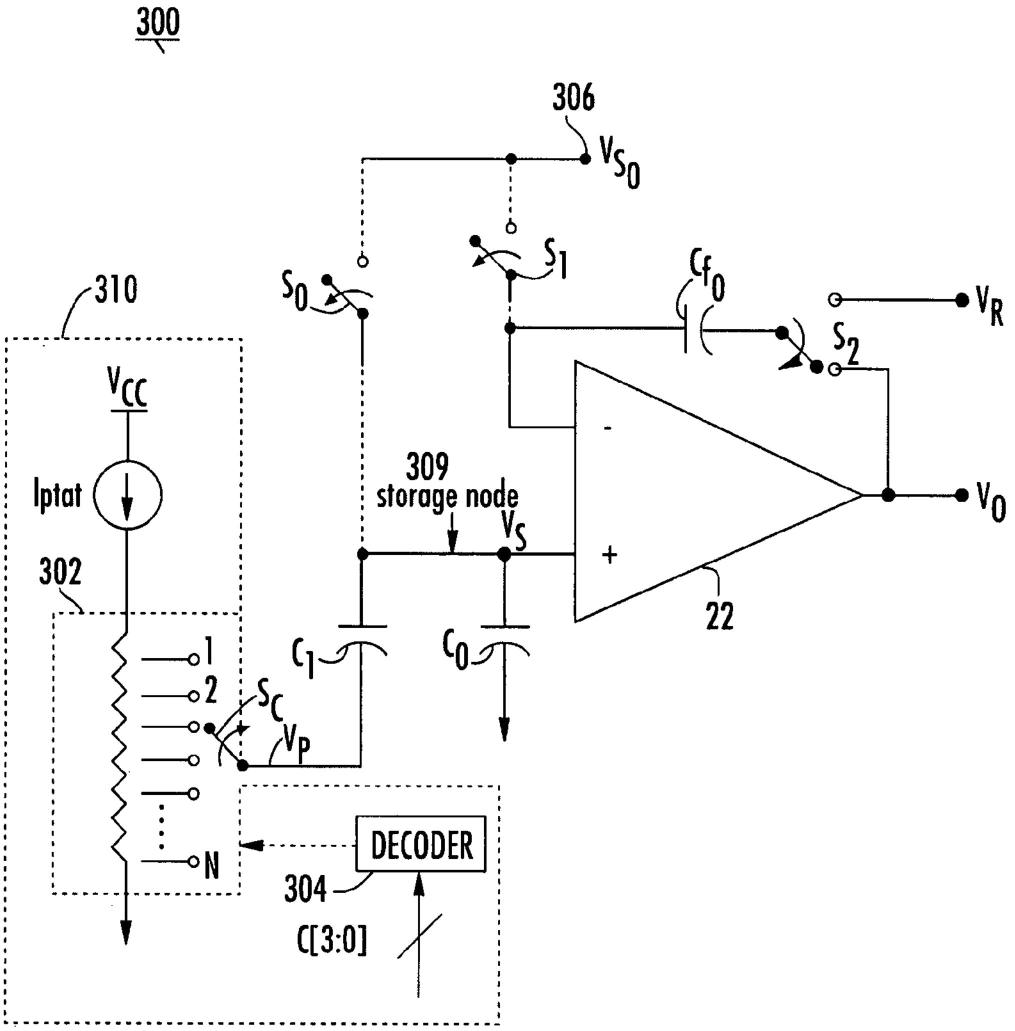
FIG. 3*c* shows an embodiment of the circuit and method according to the present invention.

FIG. 3*c* is a schematic of an embodiment of a voltage reference circuit 300 and corresponding method according to the present invention. The reference circuit 300 includes a voltage source generation circuit 310. The voltage source generation circuit 310 includes a 4 bit resistive Digital to Analog Converter (DAC) 302, schematically represented by distinct switch nodes 1-N for a switch $S_C$ that is controlled by a decoder 304. Decoder 304 receives 4 bits, C[3:0], in a conventional manner, for providing the desired programmable value of the PTAT voltage source, Vp. The reference circuit 300 also includes a storage capacitor $C_1$ connected in series between the output of DAC 302 and an end of switch $S_0$ that is connected to a noninverting input of opamp 22 at storage node 309. The other end of switch $S_0$ is coupled to an input terminal 306. A storage capacitor $C_o$ is coupled between the storage node 309 and ground. Switch $S_1$ is coupled between the input terminal 306 and the inverting input of opamp 22. Switches $S_0$ and $S_1$ are operable during the programming mode for setting the voltage on a storage node 309 and on the inverting input of an opamp 22, respectively, to a set voltage, $Vs_0$, which is coupled to the circuit 300 at input terminal 306. Switch $S_2$ is operable during the programming mode to set the output side of a feedback capacitor $C_{f0}$ to a desired reference voltage value VR. From Equations 3, it can be seen that the circuit in FIG. 3*c* provides a programmable TC of the reference voltage, $V_R$.

Figure 4:
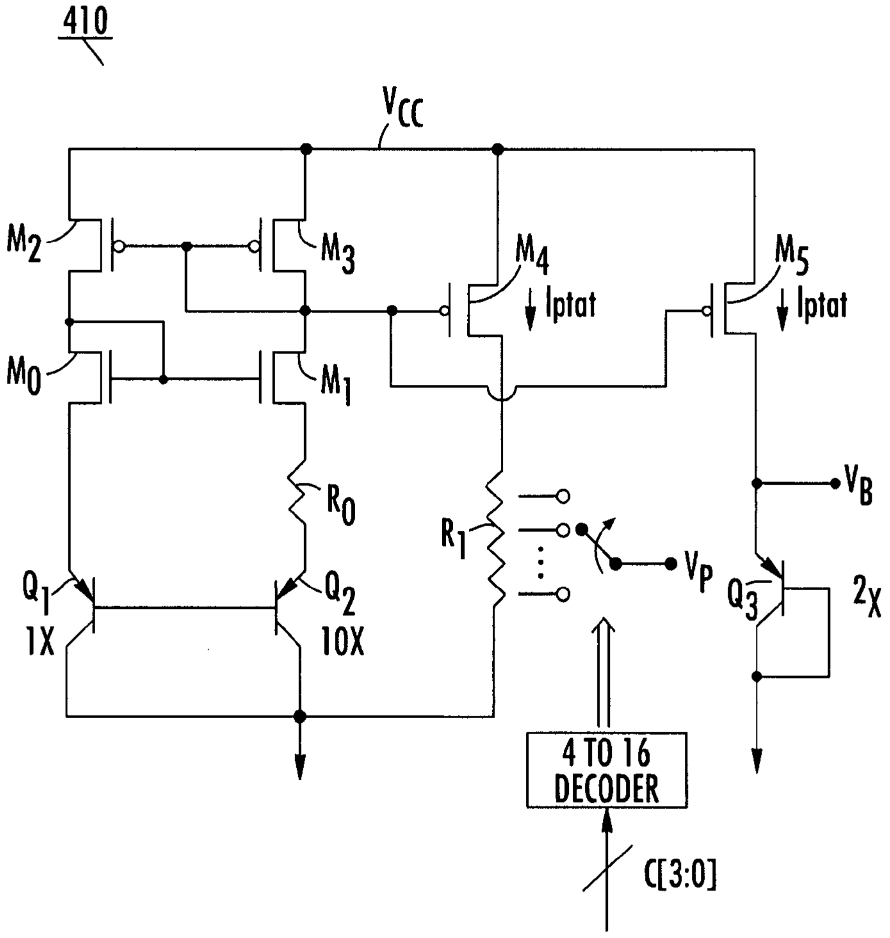
FIG. 4 is a schematic of a typical CMOS implementation of a Bandgap reference generation circuit for generating a PTAT current source $I_{ptat}$ used for generating the positive PTAT voltage source, Vp, in FIG. 3*c*, and a negative TC voltage source, $V_B$, in FIG. 5*b;*
Figure 5A:
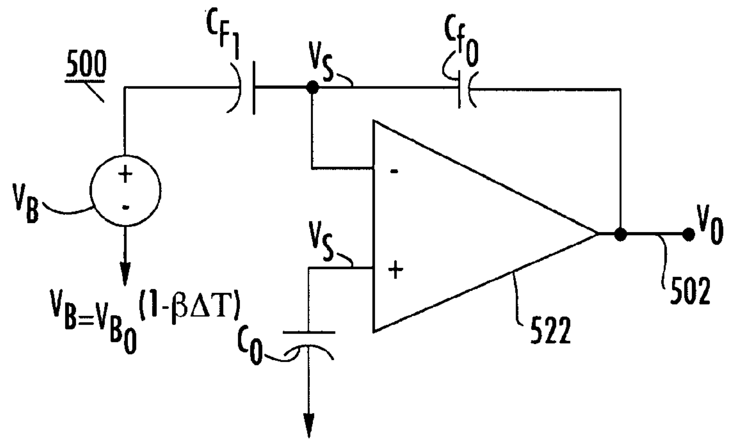
FIG. 5*a* is a simplified schematic of an alternative embodiment according to the present invention for canceling the TC of the main storage capacitor through use of a negative voltage source.
Figure 5B:
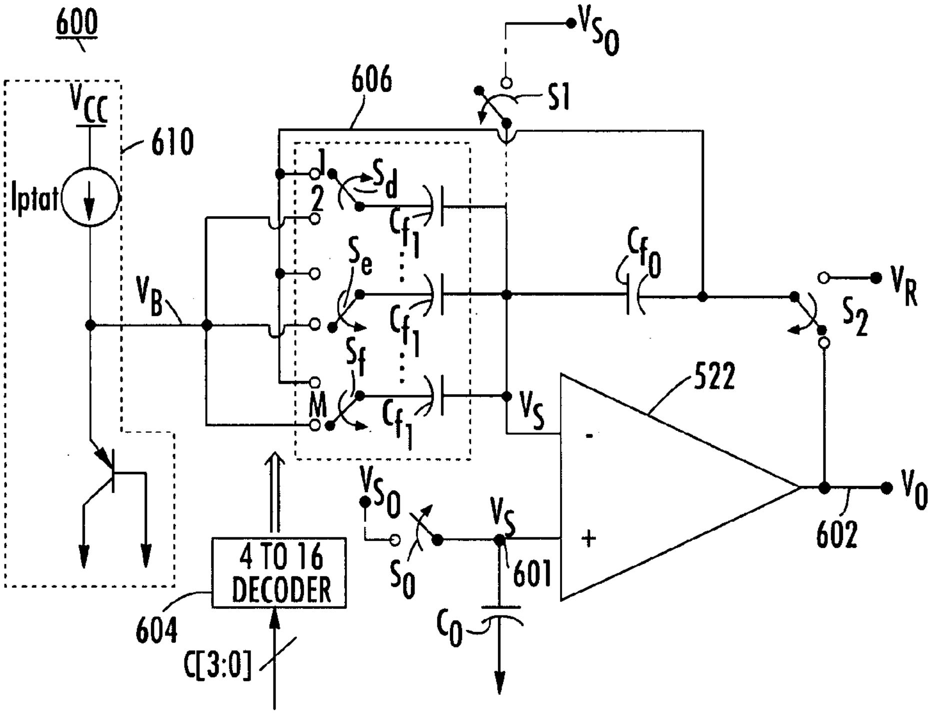
FIG. 5*b* shows a preferred embodiment of the voltage reference circuit in FIG. 5*a*.

FIG. 4 is a schematic of a typical CMOS implementation of a Bandgap reference generation circuit for generating a PTAT current source $I_{ptat}$ used for generating the positive PTAT voltage source, Vp, in FIG. 3*c*, and a negative TC voltage source, $V_B$, in FIG. 5*b*. The exemplary circuit embodiment in FIG. 4 is designed for TC compensation over −10 to +10 ppm/deg C. range with 1.25 ppm resolution to reliably achieve less than 1 ppm/deg C. TC. It would be evident to one skilled in the art to create offset or increase compensation range or resolution by simply changing the PTAT voltage DAC design in circuit 300.

Circuit 410 includes MOSFET transistors $M_0$, $M_1$, $M_2$, $M_3$, $M_4$, and $M_5$, PNP transistors $Q_1$, $Q_2$, and $Q_3$, resistor $R_0$, variable resistor $R_1$, and a 4:16 decoder. Transistors $M_0$, $M_1$, $M_2$, and $M_3$ are connected so as to provide a current mirror that causes the current in transistors Q1 and Q2 to be either equal or an exact multiple of each other. For simplification of the description, it is assumed that transistor $Q_1$ and transistor $Q_2$ conduct the same amount of current. The size of the emitter area for transistor $Q_2$ is ten times, i.e., 10×, the size for Q1, i.e., 1×. As a result, the base-emitter voltage of transistor $Q_2$, $V_{BE2}$, will be smaller than the base-emitter voltage of $Q_1$, $V_{BE1}$. The difference between the base-emitter voltages of transistors $Q_1$ and $Q_2$ is in accordance with the equation: $\Delta V_{BE}=V_{BE2}-V_{BE1}$=(kT/q)ln(10), where 10 is the ratio of the two emitter areas, k is Boltzmann's constant, and q is the electron charge. The voltages across transistor $M_0$ and $M_1$ are the same since it was assumed that the transistor $Q_1$ and transistor $Q_2$ conduct the same amount of current. This causes the voltage across resistor $R_0$ to equal (kT/q)ln(10). The corresponding current for $R_0=V_{BE}/R_0$= $(kT/R_0q)\ln(10)$ which flows through transistor $M_3$. The current through $M_4$ is the same as the current for $M_3$ and is referred to as PTAT since the current is Proportional To Absolute Temperature in accordance with $(kT/R_0q)\ln(10)$.

In circuit 410, the current flowing through variable resistor $R_1$ creates a voltage $V_p$ as a function of the resistance set for variable resistor, $R_1$ via the 4 to 16 decoder. Vp is the voltage across $R_1$ and is given by $V_P=\alpha R_1/R_0*(kT/q)\ln(10)$, where αR1 is the resistance set for variable resistance R1 via the 4 to 16 decoder.

Another sample of the current from transistor $M_3$, i.e., $I_{ptat}$ is forced to conduct from transistor $M_5$. A current $I_{ptat}$ also flows through transistor $Q_3$ and creates a voltage $V_B$. The voltage $V_B$ is the base-emitter voltage of transistor $Q_3$ since the base of Q3 is connected to ground. The temperature of a base-emitter junction of PNP transistor Q3 is known to vary by approximately −2 mv/° C. or 3000 ppm/° C. over a very broad temperature range.

FIG. 5*a* is a simplified schematic of an alternative embodiment according to the present invention for canceling the TC of the main storage capacitor through use of a negative voltage source. In the circuit 500 in FIG. 5*a*, the TC of storage capacitor $C_0$ is canceled by coupling a negative TC voltage source, $V_B$, to the inverting input of an opamp 522 via a capacitor $C_{f1}$. A feedback capacitor $C_{fo}$ is connected in series between an output terminal 502 at voltage, $V_0$, and the series combination of voltage source, $V_B$, and capacitor $C_{f1}$. The inverting and noninverting inputs of the opamp 522 are set to a voltage $V_s$. A capacitor $C_0$ is connected to the noninverting input of the opamp 522. Capacitors $C_0$, $C_{f0}$, and $C_{f1}$ are preferably comprised of a Poly1 to Poly 2 capacitor structure in CMOS technology.

FIG. 5*b* shows a circuit 600 according to a preferred embodiment of the voltage reference circuit in FIG. 5*a*. The circuit 600 includes a voltage source generator circuit 610 for generating the negative TC voltage source $V_B$. Switch $S_0$ and $S_1$ in circuit 600 is operable during a programming mode for setting the voltage on the noninverting input, i.e., storage node 601, and the inverting input of opamp 522, respectively, to a set voltage, $V_{so}$, which is coupled to the circuit 600. Switches $S_1$ and S2 are operable during a programming mode for setting the voltage on the output side of the feedback capacitor $C_{f0}$ in FIG. 5*b* to the desired reference voltage value, $V_R$.

For circuit 600, in order to adjust TC of reference voltage, V0, either the magnitude of $V_B$ or the magnitude of $C_{f1}$ can be adjusted. Referring to FIG. 5*b*, alternatively, a DAC could be used to produce a variable voltage $V_B$ for coupling to capacitor $C_{f1}$ for TC cancellation. In the preferred embodiment shown in FIG. 5*b*, $V_B$ is kept fixed and the coupling capacitor Cf1 is made variable thru a capacitive DAC arrangement as shown. The circuit 600 includes a capacitive DAC 606, schematically represented by distinct nodes 1-M for switches $S_d$, $S_e$, . . . $S_f$ that are controlled by a decoder 604. Decoder 304 receives 4 bits, C[3:0], in a conventional manner, for providing the desired programmable value of the voltage source, $V_B$, for coupling to capacitor $C_{f1}$ for TC cancellation.

The present invention according to the embodiment in FIG. 5 is designed for TC compensation over a range of −10 to +10 ppm/deg C. with 1.25 ppm resolution to reliably achieve less than 1 ppm/deg C. TC. It would be evident to one skilled in the art to create offset or increase compensation range or resolution by changing the VBE capacitive DAC or alternatively using a resistive DAC for the VBE design.

The exemplary circuit 410 in FIG. 4 includes an embodiment of the negative voltage source generator circuit 610. The negative TC voltage source, $V_B$, is generated by the base emitter junction of a PNP transistor in the Bandgap cell in FIG. 4. The negative TC voltage source $V_B$ generated by the base emitter junction as in FIG. 4 is also referred to herein as "VBE junction TC" or "VBE". For the exemplary circuit 410, the $V_B$ value is 600 mV and has a well defined TC of −3300 ppm/deg C.

Equations 4 show that, for a particular $V_B$ value, by choosing a proper ratio of $C_{f1}/C_{f0}$ or $V_{B0}$, TC can be minimized.

EQUATIONS #4:

For $V_B(t)$ such that:

$$V_B(t) = V_{B0}(1-\beta\cdot\Delta t)$$

$$\Delta t = t - t_0$$

$$V_R(t) = V_S(t) - V_{FB}(t)$$

$$\text{At } t = t_0,\ \ V_R(t_0) = V_{R0} = V_{S0} - V_{FB0}$$

$$\text{However, } \Delta V_R(t) = \Delta V_S(t) - \Delta V_{FB}(t) - \Delta V_B(t)\cdot C_{f1}/C_{f0}$$

$$= -\alpha\cdot V_{R0}\cdot\Delta t + \beta\cdot\frac{C_{f1}}{C_{f0}}\cdot V_{B0}\cdot\Delta t$$

$$TC_{V_R} = \frac{1}{V_R}\cdot\frac{\partial V_R}{\partial t}\bigg|_{t=t0} = -\alpha + \beta\cdot\frac{C_{f1}}{C_{f0}}\cdot\frac{V_{B0}}{V_{R0}}$$

Thus, by choosing a proper ratio of $C_{f1}/C_{f0}$ or $V_{B0}$, one can minimize TC.

According to an alternative embodiment of the present invention, the voltage source for the voltage reference of the present invention may also be provided by another floating gate reference.

As described above, the present invention minimizes TC more reliably in a high precision floating gate reference. The circuit and corresponding method of the present invention uses only one type of capacitor so as to provide a predictable as well as programmable TC for such references.

Although specific embodiments of the invention have been described, various modifications, alterations, alternative constructions, and equivalents are also encompassed within the scope of the invention.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. In a floating gate voltage reference circuit having a floating gate for storing charge thereon, said charge appearing at a node coupled to an input of an opamp, wherein a voltage reference output is generated at the output of the opamp as a function of the charge on said floating gate, said circuit also having a first capacitor coupled to said node; a method for improving the accuracy of the voltage reference output of said circuit as a function of temperature, comprising:

supplying a voltage source providing an output having a predetermined and substantially constant Temperature Coefficient (TC); and coupling a second capacitor in series between said voltage source and said node so as to compensate for the TC of said first capacitor; wherein said first capacitor and said second capacitor are the same type of capacitor.

2. The method of claim 1, further comprising the step of adjusting the relative size ratio of said first and second capacitors.

3. The method of claim 1, wherein said voltage source is generated using a bandgap cell.

4. The method of claim 3, wherein said voltage source is programmable, and wherein said method further comprises the step of programming said voltage source during a set mode.

5. The method of claim 3, wherein said voltage source provides a voltage proportional to absolute temperature (PTAT).

6. The method of claim 5, wherein said PTAT voltage is programmable, and wherein said method further comprises the step of programming said PTAT voltage via a resistive DAC during a set mode.

7. The method of claim 3, wherein said voltage source is a base to emitter voltage (VBE) source which provides a VBE voltage.

8. The method of claim 7, wherein said VBE voltage is programmable, and wherein said method further comprises the step of programming said VBE voltage during a set mode.

9. The method of claim 8, wherein said second capacitor comprises a capacitive DAC and said VBE voltage is programmable via said capacitive DAC.

10. The method of claim 1, wherein the TC of said voltage reference output is less than 1 ppm per degree C.

11. The method of claim 1, wherein said first and second capacitors are CMOS components.

12. A floating gate reference circuit for improving the accuracy of a voltage reference output of said circuit as a function of temperature comprising:

a floating gate for storing charge thereon, said charge appearing at a node coupled to an input of an opamp, wherein a voltage reference output is generated at the output of the opamp as a function of the charge on said floating gate;

a first capacitor coupled to said node;

a voltage source providing an output voltage having a predetermined and substantially constant TC; and a second capacitor connected in series between said voltage source and said node so as to compensate for the TC of said first capacitor; wherein said first capacitor and said second capacitor are the same type.

13. The reference circuit of claim 12, wherein the relative size ratio of said first and second capacitors is adjusted.

14. The reference circuit of claim 12, wherein said voltage source is generated using a bandgap cell.

15. The reference circuit of claim 12, wherein said voltage source is programmable during a set mode.

16. The reference circuit of claim 12, wherein said voltage source provides a voltage proportional to absolute temperature (PTAT).

17. The reference circuit of claim 16, wherein said voltage source comprises a resistive DAC such that said PTAT voltage is programmable during a set mode.

18. The reference circuit of claim 12, wherein said voltage source is a base to emitter voltage (VBE) source which provides a VBE voltage.

19. The reference circuit of claim 18, wherein said VBE voltage is programmable.

20. The reference circuit of claim 18, wherein said second capacitor comprises a capacitive DAC such that said VBE voltage is programmable via said capacitive DAC during a set mode.

21. The reference circuit of claim 12, wherein the TC of said voltage reference output is less than 1 ppm per degree C.

22. The reference circuit of claim 12, wherein said first and second capacitors are CMOS components.

23. In a floating gate voltage reference circuit having a floating gate for storing charge thereon, said charge appearing at a node coupled to a first input of an opamp, wherein a voltage reference output is generated at the output of the opamp as a function of the charge on said floating gate, said circuit also having a first capacitor coupled to said node; a method for improving the accuracy of the voltage reference output of said circuit as a function of temperature, comprising:

coupling a second capacitor to a second input of said opamp; wherein said first capacitor and said second capacitor are the same type of capacitor;

supplying a voltage source providing an output having a predetermined and substantially constant Temperature Coefficient (TC); and connecting said voltage source in series with said second capacitor so as to compensate for the TC of said first capacitor.

24. The method of claim 23, wherein said second capacitor is programmable via a capacitive DAC.

* * * * *